(12) United States Patent
Okamoto

(10) Patent No.: US 6,410,900 B1
(45) Date of Patent: Jun. 25, 2002

(54) SOLID-STATE IMAGE SENSOR AND METHOD OF DRIVING THE SAME

(75) Inventor: Fuyuki Okamoto, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/563,208

(22) Filed: May 2, 2000

(30) Foreign Application Priority Data

May 6, 1999 (JP) ............................ 11-125518

(51) Int. Cl.[7] .............................. H01L 27/00
(52) U.S. Cl. ................................. 250/208.1
(58) Field of Search ................ 250/208.1, 214.1, 250/214 R; 348/301, 302, 320, 321, 322, 323; 257/290, 291

(56) References Cited

U.S. PATENT DOCUMENTS

| | | | | |
|---|---|---|---|---|
| 5,990,471 A | * | 11/1999 | Watanabe ............. | 250/208.1 |
| 6,204,879 B1 | * | 3/2001 | Koseki et al. ......... | 348/230 |
| 6,239,839 B1 | * | 5/2001 | Matsunaga et al. .... | 348/308 |

FOREIGN PATENT DOCUMENTS

| | | |
|---|---|---|
| JP | 8-292998 | 11/1996 |
| JP | 10-313426 | 11/1998 |
| JP | 11-8805 | 1/1999 |

OTHER PUBLICATIONS

1995 IEEE International Solid–State Circuits Conference Digest of Technical Papers, pp. 226–227, "A 256×256 CMOS Active Pixel Image Sensor With Motion Detection", A. Dickinson et al.
1989 "Analog Visi and Neural Systems", Addison Wesley and C. Mead.

* cited by examiner

*Primary Examiner*—Robert H. Kim
*Assistant Examiner*—Jurie Yun

(57) ABSTRACT

There is provided a solid-state image sensor including (a) a plurality of pixels arranged in a matrix in a photoelectric transfer region, (b) at least one movement-detector located in the photoelectric transfer region, (c) a first Y-scanner making successive access to the pixels in rows in a predetermined region in the photoelectric transfer region, and (d) a first X-scanner reading out signals running through signal output lines extending through the predetermined region. The first and second scanners both scan a predetermined region associated with a movement-detector which has transmitted a detection signal. The solid-state image sensor makes it possible to immediately detect movement when it has occurred, identify a region in which movement has occurred, and detect movement while carrying out scanning in a normal mode.

21 Claims, 10 Drawing Sheets

SOLID-STATE IMAGE SENSOR AND METHOD OF DRIVING THE SAME

BACKGROUND OF THE INVENTION

1. Field of the Invention

The invention relates to a solid-state image sensor and a method of driving the same, and more particularly to a MOS-type solid-state image sensor having a function of detecting movement, and method of driving the same.

2. Description of the Related Art

A MOS-type solid-state image sensor including a plurality of pixels each having a photoelectric converter and arranged in a two-dimensional array is sometimes designed to have a function of detecting movement. Such a MOS-type solid-state image sensor not only converts a scene detected by a sensor array, into an electric signal, but also detects movement of something in a scene detected by a sensor array, and transmits a signal accordingly. In the specification, such a MOS-type solid-state image sensor having a function of detecting movement is hereinafter called a movement-sensor.

A conventional solid-state image sensor not having a function of detecting movement is explained hereinbelow with reference to FIGS. 1 and 2.

FIG. 1 is a block diagram of a conventional MOS-type solid-state image sensor, and FIG. 2 is a circuit diagram of a pixel constituting a sensor array which is a part of the MOS-type solid-state image sensor illustrated in FIG. 1.

As illustrated in FIG. 1, a conventional MOS-type solid-state image sensor is comprised of a sensor array 801 including a plurality of pixels arranged in an array, each pixel converting a light into an electric signal in accordance with brightness of an image, a scanning circuit 802 which scans electric signals converted by the pixels, a X-scanning circuit 803 which scans the electric signals converted by the pixels, and a plurality of line memories 804 each temporarily accumulating the electric signals.

The sensor array 801 is defined by a plurality of pixels arranged in a two-dimensional array. Each of the pixels is designed to include a photoelectric transfer diode. An image projected on the sensor array 801 is converted into an electric signal by the pixels.

The Y-scanning circuit 802 transmits Y-scanning signals 807 to thereby make access to the pixels row by row in the sensor array 801 from an uppermost row to a lowermost row. As a result, signals in each of rows in the sensor array 801 are concurrently read out as row signals 805.

These row signals 805 are accumulated in the line memories 804. Each of the line memories 804 is comprised of a switched capacitor, for instance. Since row signals are generally analog signals, they can be accumulated in switched capacitors by the number equal to the number of pixels existing in a row.

The X-scanning circuit 803 transmits X-scanning signals 808 to the line memories 804 to thereby make successive access to the row signals accumulated therein, and transmits an output signal 806.

As illustrated in FIG. 2, a pixel which carries out photoelectric transfer is comprised of a photodiode 901, a first n-MOSFET 902 including a gate electrically connected to a bias terminal 905, a drain electrically connected to a source voltage VDD and a source electrically connected to the photodiode 901, a second n-MOSFET 903 including a gate electrically connected to the photodiode 901, a source electrically connected to the source voltage VDD and a drain, and a third n-MOSFET 904 including a gate electrically connected to a terminal 906 through which a signal is input, a source electrically connected to the drain of the second transistor 903 and a drain electrically connected to a output line 907.

The photodiode 901 is kept biased by the first n-MOSFET 902, and hence, keeps producing photoelectric current. A bias voltage is applied to the first n-MOSFET 902 through the bias terminal 905. A voltage at the drain of the first n-MOSFET 902 is output at a low impedance through the second n-MOSFET 903.

The third n-MOSFET 904 acts as a switch. When the third n-MOSFET 904 makes access to a pixel, the third n-MOSFET 904 is turned on by the Y-scanning circuit 802 through the terminal 906. When the third n-MOSFET 902 is caused to be turned on, a pixel output signal is transmitted through the output line 907.

The conventional solid-state image sensor has such a structure as mentioned above, and operates in the above-mentioned way. If a movement sensor is designed based on the above-mentioned conventional solid-state image sensor, the movement sensor would have such a structure as mentioned below.

FIG. 3 is a block diagram of a conventional movement sensor having a structure designed based on the structure of the solid-state image sensor illustrated in FIG. 1. The movement sensor illustrated in FIG. 3 is comprised of a sensor array 1001 including a plurality of pixels arranged in a matrix array, each pixel converting a light into an electric signal in accordance with brightness of an image, a Y-scanning circuit 1002 which scans electric signals converted by the pixels, a X-scanning circuit 1003 which scans the electric signals converted by the pixels, a plurality of line memories 1004 each temporarily accumulating the electric signals, and a plurality of differential circuits 1007 electrically connected between the line memories 1004 and the X-scanning circuit 1003.

In brief, the movement sensor additionally includes the differential circuit 1007 in comparison to the solid-state image sensor illustrated in FIG. 1.

The Y-scanning circuit 1002 transmits Y-scanning signals 1009 to the sensor array 1001 to thereby make access to the pixels row by row in the sensor array 1001 from an uppermost row to a lowermost row. As a result, signals in each of rows in the sensor array 1001 are concurrently read out as first row signals 1005. These first row signals 1005 are accumulated in the line memories 1004.

Then, the Y-scanning circuit 1002 makes access again to the pixel row which has been previously accessed. As a result, signals in the row are read out as second row signals 1008, which are accumulated in the line memories 1004. The line memories 1004 separately transmits the first and second row signals a 1005 and 1008 to the differential circuits 1007. The differential circuits 1007 calculates a difference between the first and second row signals 1005 and 1008. The calculation is concurrently carried out for all the first and second row signals 1005 and 1008 transmitted from a pixel row.

The movement sensor illustrated in FIG. 3 includes the differential circuits 1007 by the number equal to the number of pixels in a row in the sensor array 1001.

Output signals transmitted from the differential circuits 1007, each indicating a difference between the first and second row signals 1005 and 1008, are successively read out in accordance with X-scanning signals 1010 transmitted by the X-scanning circuit 1003. The thus read-out output signals are transmitted from the X-scanning circuit 1003 as output signals 1006.

In the above-mentioned movement sensor, since signals are read out twice from the same pixel row at a certain interval and a difference between the signals is calculated, the differential circuits 1007 transmit non-zero output signals for pixels in which a light intensity varies. When the differential circuits 1007 transmits such non-zero output signals, it is deemed that movement has occurred in the sensor array 1001.

It should be noted that the movement sensor illustrated in FIG. 3 does never spoil functions of the conventional solid-state image sensor illustrated in FIG. 1. Accordingly, the movement sensor can act as a solid-state image sensor. When the movement sensor acts as a solid-state image sensor, the Y-scanning circuit 1002 successively makes access to pixels row by row in the sensor array 1001, and signals which were read out from each of rows are output through the differential circuits 1007.

A movement sensor such as the above-mentioned one is detailed is described, for instance, in 1995 IEEE International Solid-State Circuits Conference Digest of Technical Papers, pp. 226–227, "A 256×256 CMOS Active Pixel Image Sensor with Motion Detection", A. Dickinson et al.

Apart from the above-mentioned Technical Papers, Japanese Unexamined Patent Publication No. 8-292998 has suggested an image detector including a sensor cell array which can accomplish an operation between pixels when accumulated electric charges associated with a pixel signal are read out, an amplifier, an analog-digital convertor, a scanner and a multiplexer which operate with each other to scan a designated area, and a control circuit. An area in which a target pattern exists is detected by virtue of the operation between pixels carried out by the sensor cell array. The scanner and the multiplexer randomly scans the thus detected area to thereby read out image data therefrom. Thus, only an area in which a target pattern exists is read out among all of input images, ensuring high rate at which images are processed.

Japanese Unexamined Patent Publication No. 10-313426 has suggested a solid-state image sensor having a function of detecting movement, comprised of pixels each transmitting an electric signal in accordance with an intensity of incident light, vertical signal lines each associated with each of columns of the pixels, a vertical scanning circuit which transfers electric signals transmitted from a certain row of the pixels, to the associated vertical signal line at a predetermined timing, and a horizontal scanning circuit which transfers the electric signals to horizontal signal lines. Differential circuits are arranged in the vertical signal lines. The differential circuits accumulates electric signals transmitted at a timing from the pixels as signals of the previous frame and also accumulates electric signals transmitted at the next timing from the same pixels as electric signals of the present frame. The differential circuits compare those electric signals to each other to thereby transmit output signals indicative of comparison results.

Japanese Unexamined Patent Publication No. 11-8805 has suggested a solid-state image sensor having a function of detecting movement. A plurality of pixels are arranged in a matrix. Each of columns of the pixels is electrically connected to a vertical signal line. A vertical scanning circuit selects a row, reads out signals out of the selected row of pixels, and transfers the thus read out signals to the associated vertical signal line. A signal comparison circuit and a video-signal generating circuit are positioned in each of the vertical signal lines. The signal comparison circuit accumulates electric signals transmitted at a timing from the pixels as signals of the previous frame, and also accumulates electric signals transmitted at the next timing from the same pixels as electric signals of the present frame. The signal comparison circuit compares those electric signals to each other to thereby transmit an output signal indicative of comparison result, to a shift register. The video-signal generating circuit generates a video signal in accordance with electric signals of the present frame, and transmits the video signal to a horizontal scanning circuit.

However, the movement sensors as mentioned above are accompanied with the following problems.

The first problem is that it takes about one frame period of time to detect movement. Herein, the term "one frame period of time" means a time necessary for the Y-scanning circuit 1002 to scan pixels from a first row to a bottom row. In other words, the term "one frame period of time" means a time necessary for transmitting signals defining one scene.

For instance, it is now assumed that an image varies with the lapse of time at a lower end of the sensor array 1001. This variation in an image can be first detected only when the Y-scanning circuit 1002 makes access to the pixels in a lowermost row of pixels. Since the Y-scanning circuit 1002 has made access to all rows of pixels until the Y-scanning circuit 1002 makes access to the pixels in a lowermost row of pixels, much time already passes after the variation in an image has actually occurred.

After detection of movement, an operator often desires to see a quite small area including an area in which the movement has been detected. However, it is impossible to do so by the conventional movement sensor. This is the second problem.

The third problem is that the conventional movement sensor cannot detect movement while it is operating as a solid-state image sensor, that is, not as a movement sensor, and in addition, the conventional movement sensor cannot act as a solid-state image sensor while it is in operation of detecting movement.

SUMMARY OF THE INVENTION

In view of the above-mentioned problems, it is an object of the present invention to provide a solid-state image sensor which is capable of immediately detecting movement when it has occurred, identifying an area including an area in which movement has occurred, detecting movement even while it is operating as a solid-state image sensor, and independently carrying out reading out a signal from an area in which movement has occurred and reading out signals from entire pixels in a sensor array.

In one aspect of the present invention, there is provided a solid-state image sensor including (a) a plurality of pixels arranged in a matrix in a photoelectric transfer region, A) at least one movement-detector located in the photoelectric transfer region, (c) a first Y-scanner making successive access to the pixels in rows in a predetermined region in the photoelectric transfer region, and (d) a first X-scanner reading out signals running through signal output lines extending through the predetermined region, the first and second scanners both scanning a predetermined region associated with a movement-detector which has transmitted a detection signal.

It is preferable that the solid-state image sensor includes a plurality of ovement-detectors randomly positioned in the photoelectric transfer region.

For instance, the predetermined region may be a region extensive around the movement-detector.

It is preferable that the solid-state image sensor further includes (e) a second Y-scanner making successive access to all of the pixels in rows in the photoelectric transfer region, and (f) a second X-scanner reading out signals running through all of signal output lines extending through the photoelectric transfer region.

It is preferable that the solid-state image sensor further includes (g) a first switch to which the first Y-scanner makes access, and (h) a second switch to which the second Y-scanner makes access, a first signal being read through the first switch being output to a first signal output line, and a second signal being read through the second switch being output to a second signal output line.

It is preferable that the first NY- and X-scanners operate independently of the second Y- and X-scanners.

For instance, the predetermined region may be designed to have a size defined by M pixels×N pixel wherein M and N are integers not greater than the number of pixels defining the solid-state image sensor.

It is preferable that each of the pixels is comprised of (a1) a photodiode, (a2) a first transistor including a gate electrically connected to the photodiode, a source electrically connected to a voltage source, and a drain, and (a3) a second transistor including a gate electrically connected to a terminal through which a signal is input, a source electrically connected to the drain of the first transistor and, a drain electrically connected to a first output line.

It is also preferable that each of the pixels is comprised of (a1) a photodiode, (a2) a first transistor including a gate electrically connected to the photodiode, a source electrically connected to a voltage source, and a drain, (a3) a second transistor including a gate electrically connected to a terminal through which a signal is input, a source electrically connected to the drain of the first transistor and, a drain electrically connected to a first output line, and (a4) a third transistor including a gate electrically connected to a terminal through which a signal is input, a source electrically connected to both the drain of the first transistor and the source of the second transistor, and a drain electrically connected to a second output line, wherein when the second transistor is turned on, a pixel output is transmitted through the first output line, when the third transistor is turned on, a pixel output is transmitted through the second output line, and when both the second and third transistors are turned on, a pixel output is transmitted through both the first and second output lines.

There is further provided a solid-state image sensor including (a) a plurality of pixels arranged in a photoelectric transfer region defined by a plurality of sub-regions, (b) a plurality of movement-detectors randomly arranged in the photoelectric transfer region, each of the movement-detectors detecting movement which has occurred in the photoelectric transfer region, and transmitting a detection signal, and (c) a scanner identifying a pixel transmitting the detection signal to thereby identify a sub-region in which the movement has occurred.

For instance, the scanner may be comprised of a first Y-scanner making successive access to the pixels in rows in the photoelectric transfer region, and a first X-scanner reading out signals transmitted from the photoelectric transfer region, the first Y- and X-scanners identifying the sub-region associated with a movement-detector which has transmitted the detection signal.

It is preferable that the solid-state image sensor further includes (e) a second Y-scanner making successive access to all of the pixels in rows in the photoelectric transfer region, and (i) a second X-scanner reading out all signals transmitted from the photoelectric transfer region.

It is preferable that the solid-state image sensor further includes (g) a first switch to which the first Y-scanner makes access, and (h) a second switch to which the second Y-scanner makes access, a first signal being read through the first switch being output to a first signal output line, and a second signal being read through the second switch being output to a second signal output line.

In another aspect of the present invention, there is provided a method of driving a solid-state image sensor, including the steps of (a) transmitting a detection signal when movement has been detected in a photoelectric transfer region including a plurality of sub-regions, and (b) starting scanning a sub-region associated with a detecting circuit which has transmitted the detection signal.

It is preferable that the method further includes the step of stopping scanning the photoelectric transfer region when movement is detected while the photoelectric transfer region is being scanned in entirety, and starting scanning a sub-region associated with a detecting circuit which has detected the movement.

It is preferable that the method further includes the step of, when a second detecting circuit has transmitted a second detection signal indicating that movement had been detected in a second sub-region while a first sub-region is being scanned in response to a first detection signal transmitted by a first detecting circuit, indicating that movement had been detected in the first sub-region, starting scanning the second sub-region after the first sub-region has been completed to be scanned.

It is preferable that the method further includes the step of, when a second detecting circuit has transmitted a second detection signal indicating that movement had been detected in a second sub-region while a first sub-region is being scanned in response to a first detection signal transmitted by a first detecting circuit, indicating that movement had been detected in the first sub-region, immediately starting scanning the second sub-region, if the first and second sub-regions do not have common row and column.

It is preferable that when movements have been detected in a plurality of sub-regions, the sub-regions are scanned in accordance with a predetermined order.

The advantages obtained by the aforementioned present invention will be described hereinbelow.

In the solid-state image sensor in accordance with the present invention, a plurality of the movement-detectors are randomly arranged in a photoelectric transfer region independently of the pixels. The movement-detectors detect movement having occurred in a photoelectric transfer region regardless of whether the solid-state image sensor acts as an ordinary solid-state image sensor or a movement sensor. A detection signal transmitted by the movement-detectors when they detect movement in a photoelectric transfer region is immediately transmitted to the first X- and scanning circuits, which in response scan a pixel identified by the detection signal. Hence, the solid-state image sensor makes it possible to detect movement independently of a frame period, ensuring reduction in a time necessary for detecting movement in comparison with a conventional solid-state image sensor.

In addition, the solid-state image sensor in accordance with the present invention can detect movement while it operates as an ordinary solid-state image sensor, that is, it scans a photoelectric transfer region in entirety.

In accordance with the solid-state image sensor, it is possible to pick up images associated with a region in which movement has been detected, by means of the first X- and Y-scanning circuits.

Furthermore, by designing each one of the pixels to include two switches to each of which the first and second Y-scanning circuits make access. and designing the pixel to transmit output signals to separate output signal lines, the solid-state image sensor can scan a photoelectric transfer region in entirety and scan a sub-region in which movement has been detected, at the same time.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 4:
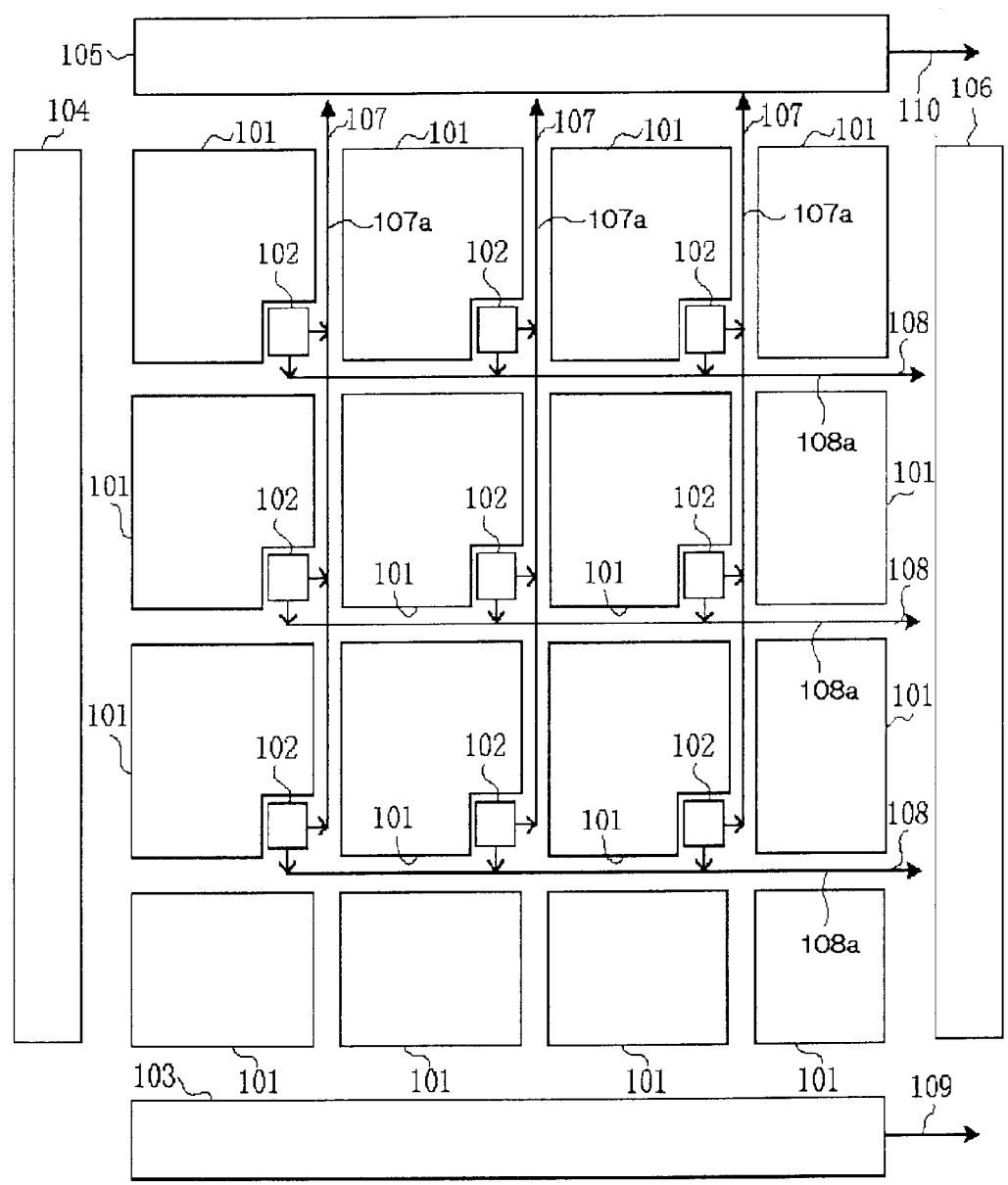
FIG. 4 is a block diagram of a solid-state image sensor in accordance with the first embodiment of the present invention.

FIG. 4 illustrates a solid-state image sensor in accordance with the first embodiment of the present invention.

The illustrated solid-state image sensor is comprised of sixteen rectangular sensor arrays 101 arranged in a matrix, nine movement detecting circuits 102, a first X-scanning circuit 105, a first Y-scanning circuit 106, a second X-scanning circuit 103, and a second Y-scanning circuit 104.

Figure 2:
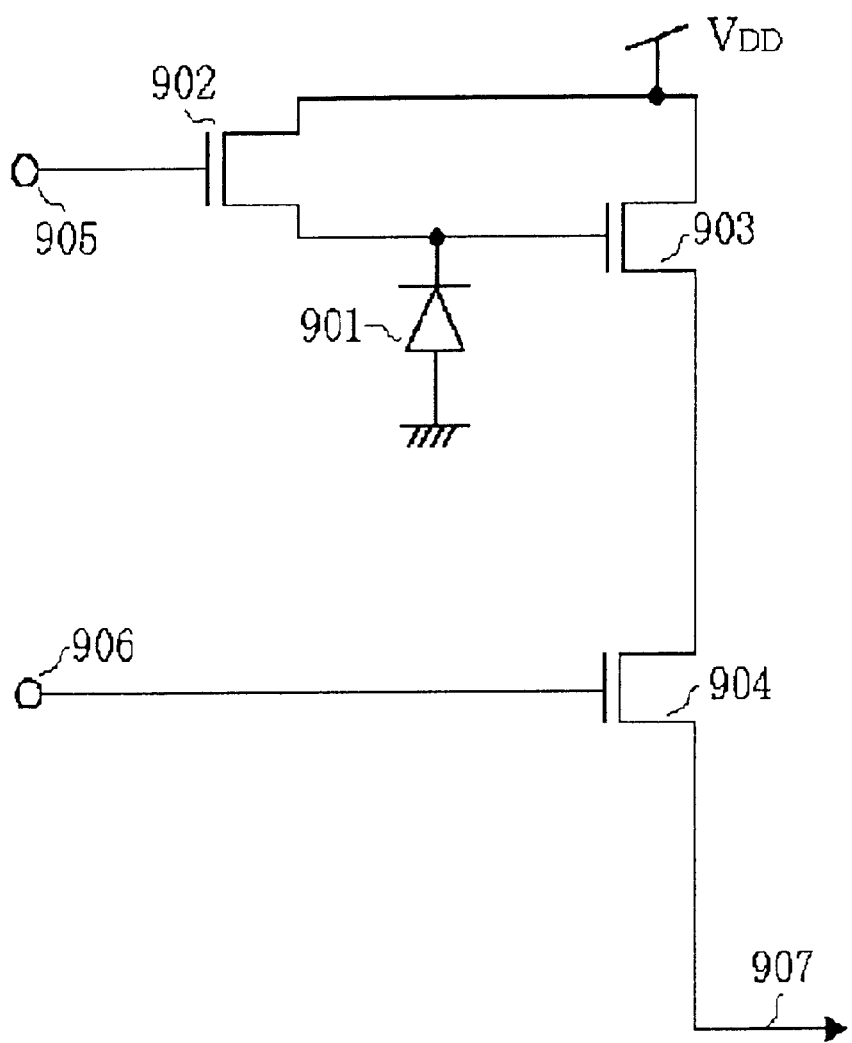
FIG. 2 is a circuit diagram of a pixel which is a part of the conventional MOS-type solid-state image sensor illustrated in FIG. 1.
Figure 3:
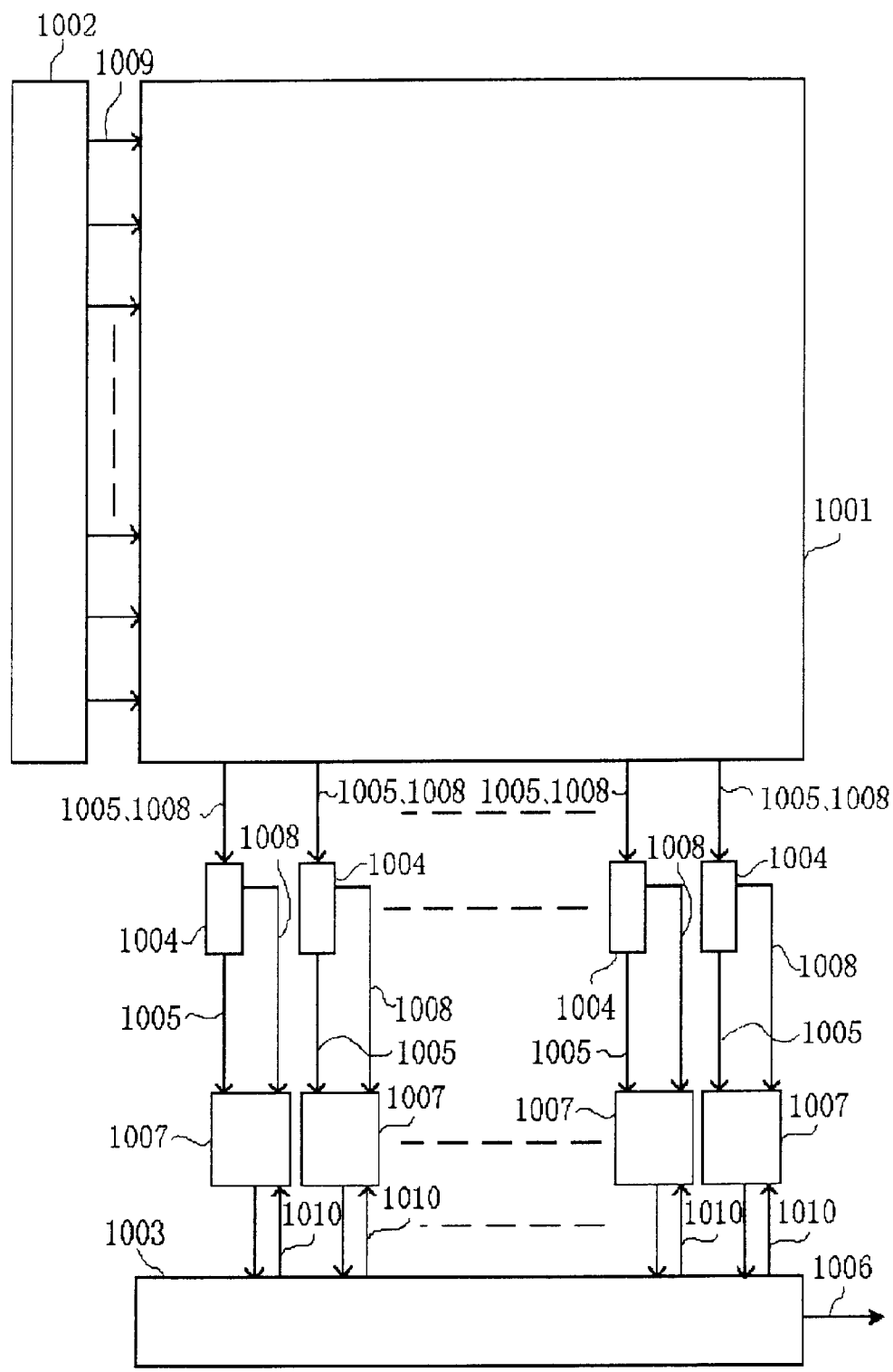
FIG. 3 is a block diagram of a conventional MOS-type solid-state image sensor having a function of detecting movement.

The sixteen rectangular sensor arrays 101 define a photoelectric transfer region. Each of the sensor arrays 101 is comprised of a plurality of pixels arranged in a two-dimensional array. Each of the pixels has such a structure as illustrated in FIG. 2.

Each of the movement detecting circuits 102 is positioned at a gap formed between the adjacent sensor arrays 101. The movement detecting circuits 102 are arranged in a 3×3 matrix. Namely, the movement detecting circuits 102 are spaced away from one another in a photoelectric transfer region. In comparison with the solid-state image sensor illustrated in FIG. 1, the sensor array 801 is divided into the sixteen sensor arrays 101, and the movement detecting circuits 102 are positioned between the adjacent sensor arrays 101 in the first embodiment.

In the solid-state image sensor illustrated in FIG. 4, the sensor arrays 101 are successively accessed by the second X-scanning circuit 103 and the second Y-scanning circuit 104. That is, pixels in each of the sensor arrays 101 are successively accessed from a top row to a bottom row like the conventional solid-state image sensor having no movement detecting circuits, illustrated in FIG. 1.

When movement has been detected in a photoelectric transfer region, the movement detecting circuit 102 transmits a detection signal indicative of detection of movement, to the first X-scanning circuit 105 as a first detection signal 107 through a first signal line 107a, and to the first Y-scanning circuit 106 as a second detection signal 108 through a second signal line 108a.

Figure 5:
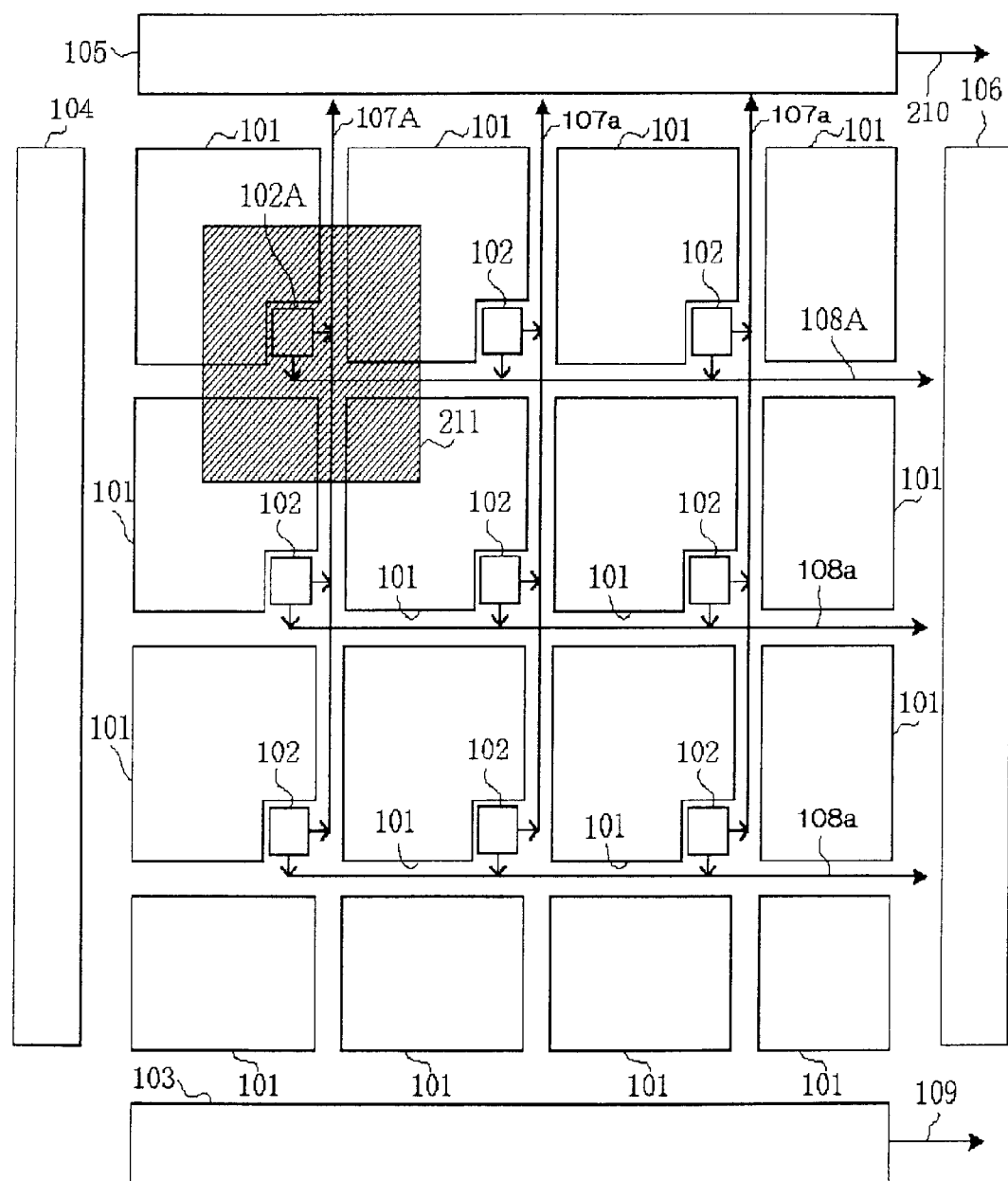
FIG. 5 illustrates a sub-region in which movement is to be detected.

The first X-scanning circuit 105 and the first Y-scanning circuit 106 do not scan all pixels arranged in a photoelectric transfer region, but scan only a rectangular area located close to a movement detecting circuit which has transmitted a detection signal. For instance, with reference to FIG. 5, if a movement detecting circuit 102.A transmits a detection signal, the first X-scanning circuit 105 and the first Y-scanning circuit 106 scan a rectangular area 211 extensive around the movement detecting circuit 102A.

Specifically, when the movement detecting circuit 102A transmits a detection signal, a first signal line 107A and a second signal line 108A are both activated. Then, the first X-scanning circuit 105 and the first Y-scanning circuit 106 start scanning the rectangular area 211. As a result, the first X-scanning circuit 105 transmits an image signal as a local area signal 210.

The local area 211 is designed in advance to have a size of M pixel×N pixel wherein M and N are integers not greater than the number of pixels constituting the solid-state image sensor.

Figure 1:
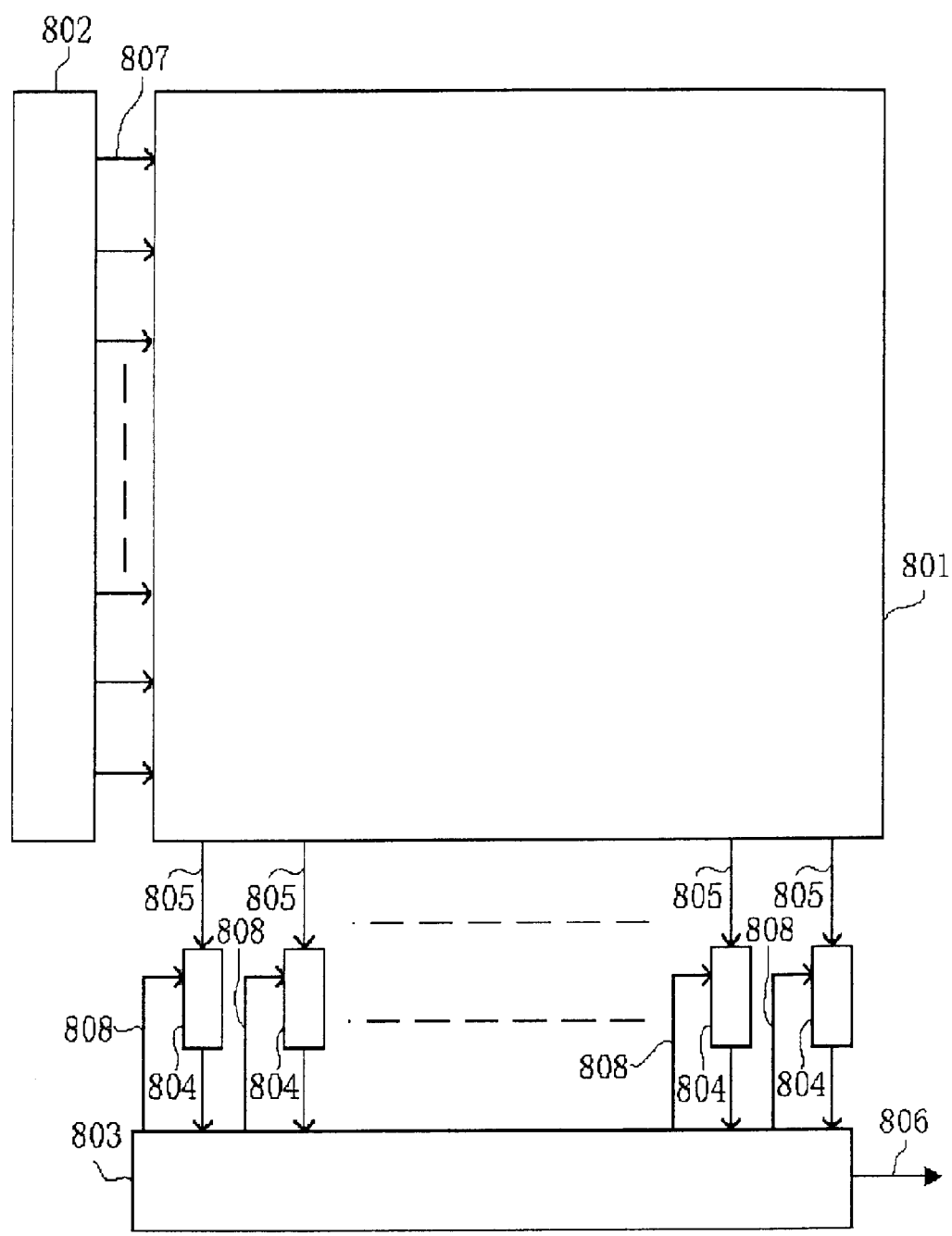
FIG. 1 is a block diagram of a conventional MOS-type solid-state image sensor.

A sensor array may be divided into the desired number of sensor arrays. Though the sensor array 801 illustrated in FIG. 1 is divided into the sixteen sensor arrays 101 in the first embodiment, the number by which the sensor array 801 is divided is not to be limited to sixteen.

The position and the number of the movement detecting circuits 102 are not to be limited to those illustrated in FIG. 4. It is not always necessary to position the movement detecting circuits 102 in a matrix as illustrated in FIG. 4. In addition, it is not always necessary for the solid-state image sensor to include a plurality of the movement detecting circuits 102. The solid-state image sensor may be designed to include only one movement detecting circuit 102.

Figure 6:
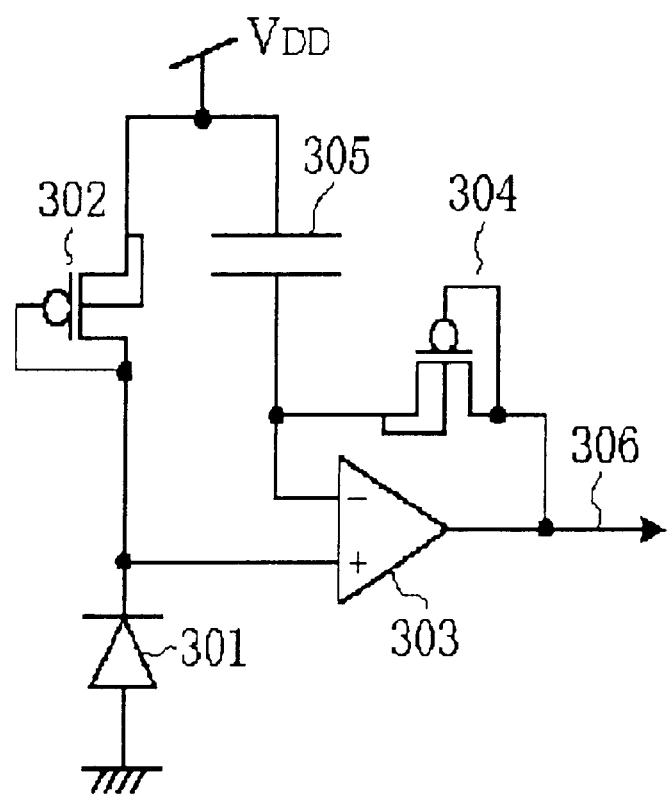
FIG. 6 is a circuit diagram of a movement detecting circuit.

FIG. 6 is a circuit diagram illustrating an example of a structure of the movement detecting circuit 102. Strictly speaking, the circuit illustrated in FIG. 6 is a circuit for detecting how an intensity of an incident light varies with the lapse of time. This circuit is detailed in "Analog VLSI and Neural Systems", Addison Wesley and C. Mead.

The movement detecting circuit 102 is comprised of a photodiode 301, a first p-MOSFET 302 including a drain through which an output signal transmitted from the photodiode 301 is introduced, a gate electrically connected to the drain, and a source electrically connected to a source voltage VDD, an amplifier 303 having a positive input through which an output signal transmitted from the photodiode 301 is introduced and a negative input, a capacitor 305 electrically connected between the source voltage VDD and the negative input of the amplifier 303, and a second p-MOSFET 304 including a source electrically connected to a node located intermediate between the capacitor 305 and the negative input of the amplifier 303, a drain, and a gate electrically connected to the drain.

The illustrated movement detecting circuit 102 operates as follows.

It is now assumed that an intensity of a light radiated to the photodiode 301 varies with the lapse of time. Since a current flowing through the first p-MOSFET 302 varies in an intensity, a voltage at the drain of the first p-MOSFET 302, which is equal to a voltage at the gate of the first p-MOSFET 302, also varies. Accordingly an input to the positive input of the amplifier 303 also varies.

Since an output 306 transmitted from the amplifier 303 is negatively fed back to the amplifier 303 through the second p-MOSFET 304, the output 306 follows a voltage input into the amplifier 303. However, since the capacitor 305 is incorporated in the feed-back loop, it takes some time until a voltage input through the negative input becomes equal to a voltage input through the positive input. Hence, there is a big difference in those voltages in such transition period, and accordingly, the amplifier 303 transmits a signal having a quite great magnitude. After some time has passed, the voltage input through the positive input becomes equal to the voltage input through the negative input.

Figure 7:
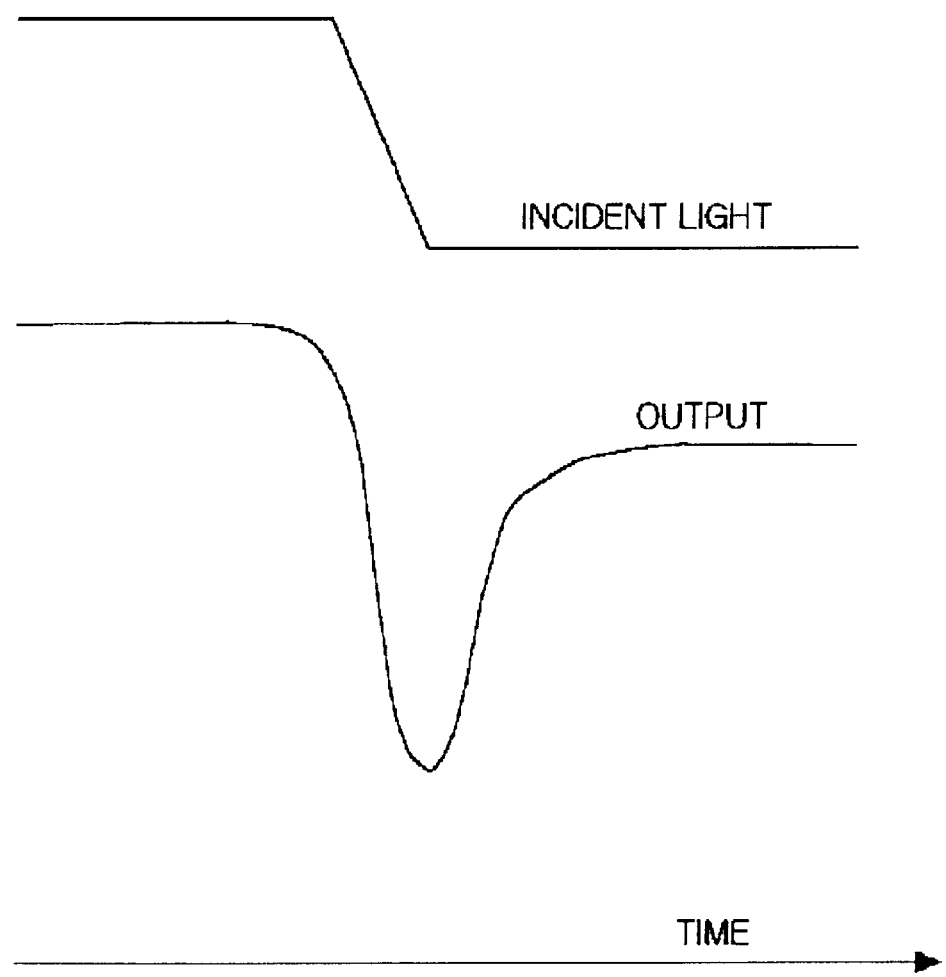
FIG. 7 is a graph showing a relation between an incident light and an output in the movement detecting circuit illustrated in FIG. 6.

FIG. 7 is a graph showing how the output 306 varies with the lapse of time. Though FIG. 7 shows a curve of the output 306 found when an intensity of an incident light is decreased with the lapse of time, there is obtained a curve which is similar to the curve illustrated in FIG. 7, but is upwardly projecting, when an intensity of an incident light is increased with the lapse of time.

As is obvious in view of FIG. 7, the movement detecting circuit illustrated in FIG. 6 transmits an output having a great magnitude, when an intensity of an incident light varies.

Apart from the movement detecting circuit illustrated in FIG. 6, there re many examples of an analog circuit of detecting how an intensity of an incident light varies with the lapse of time. For instance, many examples of a ovement sensor are described in the above-mentioned reference "Analog VLSI and Neural Systems".

Figure 8:
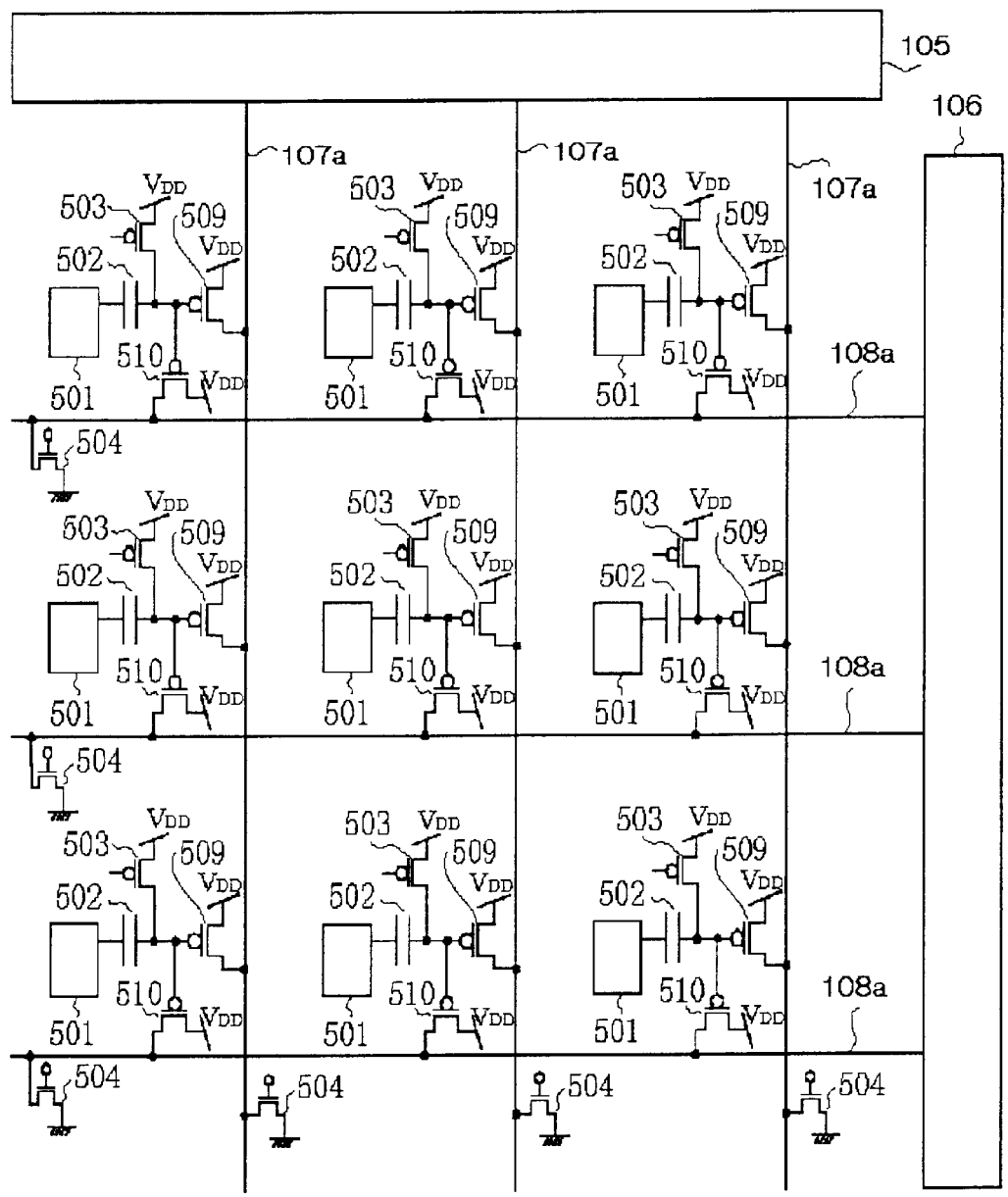
FIG. 8 is a block diagram of the solid-state image sensor in accordance with the first embodiment, showing connection between the movement detecting circuit and detecting signal lines.

FIG. 8 is a circuit diagram of the solid-state image sensor including the movement detecting circuits illustrated in FIG. 6.

A movement detecting circuit 501 having the structure as illustrated in FIG. 6 is electrically connected to both the first and second signal lines 107a and 108a through a capacitor 502 and first to third p-MOSFETs 509, 510 and 503. In FIG. 8, the second X-scanning circuit 103 and the second Y-scanning circuit 104 are omitted for simplification.

The movement detecting circuit 501 transmits an output thereof to a connection node at which the first to third p-MOSFETs 509, 510 and 503 are electrically connected, through the capacitor 502. The capacitor 502 accomplishes AC-coupling among the movement detecting circuit 501 and the p-MOSFETs 509, 510 and 503. The third p-MOSFET 503 enhances a voltage at the right side of the capacitor 502 to a source voltage VDD.

By designing the third p-MOSFET 503 to be driven by small power, AC components transmitted from the movement detecting circuit 501 can be transferred to the first and second p-MOSFETs 509 and 510. On receipt of the AC components from the movement detecting circuit 501, the first and second p-MOSFETs 509 and 510 activate the first and second signal lines 107a and 108a, respectively Each one of the first and second signal lines 107a and 108a is electrically connected to a n-MOSFET 504 for slowly reduce voltages of the first and second signal lines 107a and 108a to a ground level. Each of the n-MOSFETs 504 receives a biased input through a gate thereof.

The solid-state image sensor illustrated in FIG. 8 operates as follows.

When any one of the movement detecting circuits 501 detects variation in an intensity of an incident light, the first X- and Y-scanning circuits 105 and 506 judges which circuit has detected movement among the nine movement detecting circuits 501. Then, the first X- and Y-scanning circuits 105 and 106 start scanning an area extensive around the movement detecting circuit 501 which has detected movement.

In the solid-state image sensor illustrated in FIG. 8, the first and second signal lines 107a and 108a are activated by a detection signal which is transmitted from a movement detecting circuit 501 when the movement detecting circuit 501 detects reduction in an intensity of an incident light.

If the first and second signal lines 107a and 108a are intended to be activated by a detection signal which is transmitted from a movement detecting circuit 501 when the movement detecting circuit 501 detects increase in an intensity of an incident light, it would be obvious for those skilled in the art to design the solid-state image sensor illustrated in FIG. 8 to include first and third p-MOSFETs having polarities opposite to the polarities of the first to third p-MOSFETs 509, 510 and 503, in place of the first to third p-MOSFETs 509. 510 and 503.

Hereinbelow is explained an operation of the solid-state image sensor in accordance with the first embodiment.

The second X- and Y-scanning circuits 103 and 104 scan all the pixels arranged in the sensor arrays 101. The first X- and Y-scanning circuits 105 and 106 scan a local area such as the area 211 illustrated in FIG. 5, when they receive a detection signal from any one of the movement detection circuits 102. A detection signal transmitted from the movement detection signal 102 is transferred to the first X- and Y-scanning circuits 105 and 106 through the first and second signal lines 107a and 108a vertically and horizontally extending through the sensor arrays 101, respectively.

Hereinbelow an operation of the solid-state image sensor in the case that a plurality of the movement detecting circuits 102 concurrently transmits detection signals and that areas associated with those movement detecting circuits 102 overlap each other. If a detection signal is newly transmitted while a first local area associated with a movement detecting circuit 102 having transmitted a detection signal is being scanned, a second local area associated with the movement detecting circuit 102 having newly transmitted a detection signal starts to be scanned after the first local area has been finished to be scanned. However, if the first and second local areas do not overlap each other, that is, if there is no X and Y scanning lines passing through both the first and second local areas, it is possible to concurrently scan both the first, and second local areas.

If a plurality of the movement detecting circuits 102 concurrently transmit detection signals, a local area to be scanned is determined in accordance with a predetermined order, for instance, an address assigned to each of the pixels.

Figure 9:
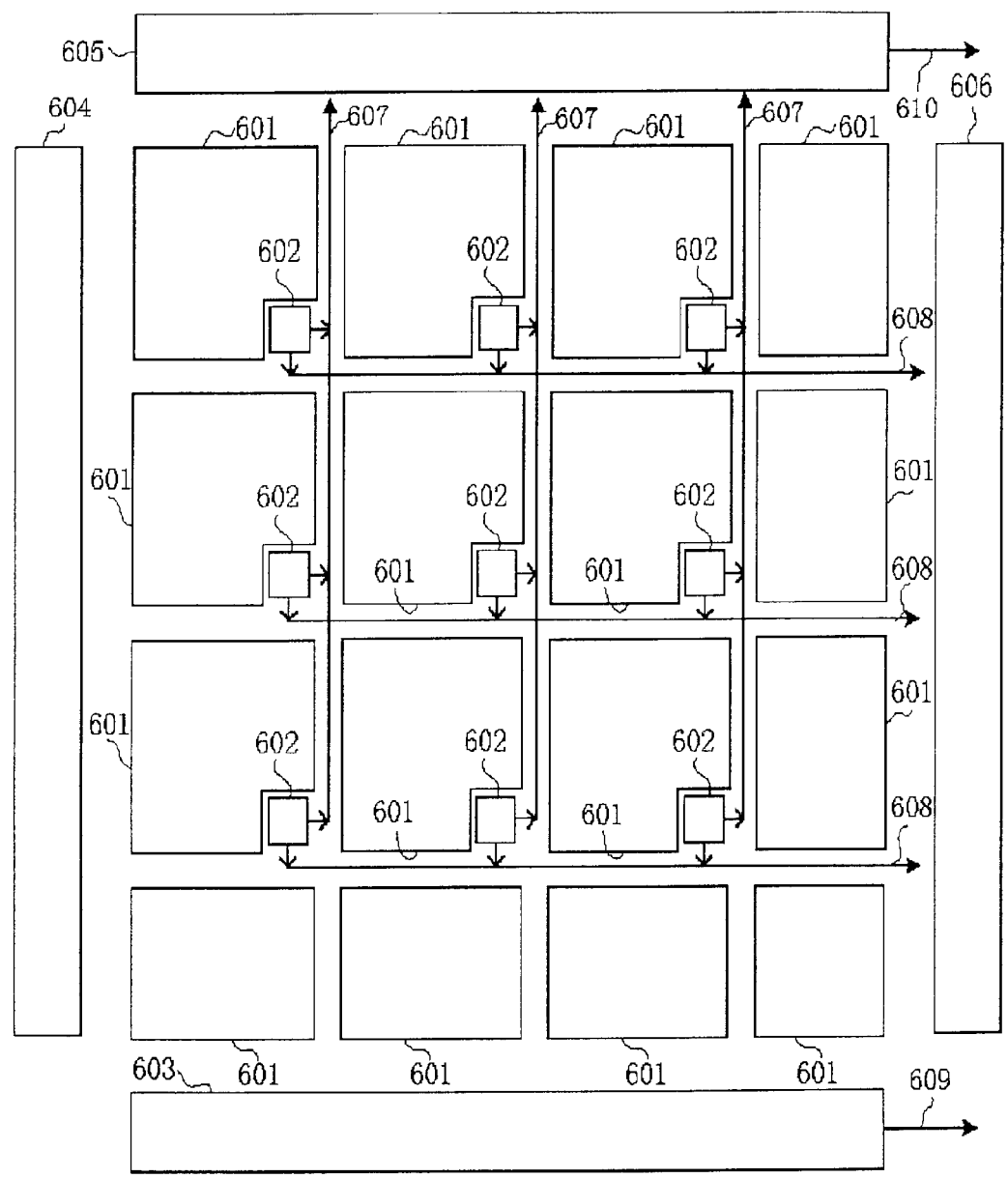
FIG. 9 is a block diagram of a solid-state image sensor in accordance with the second embodiment of the present invention.

FIG. 9 is a block diagram of a solid-state image sensor in accordance with the second embodiment.

The illustrated solid-state image sensor is comprised of sixteen rectangular sensor arrays 601 arranged in a matrix, nine movement detecting circuits 602 arranged in a 3×3 matrix and positioned at a gap formed between the adjacent sensor arrays 601, a first X-scanning circuit 605, a first Y-scanning circuit 606, a second X-scanning circuit 603, and a second Y-scanning circuit 604.

The sixteen rectangular sensor arrays 601 define a photoelectric transfer region. Each of the sensor arrays 601 is comprised of a plurality of pixels arranged in a two-dimensional array.

Figure 10:
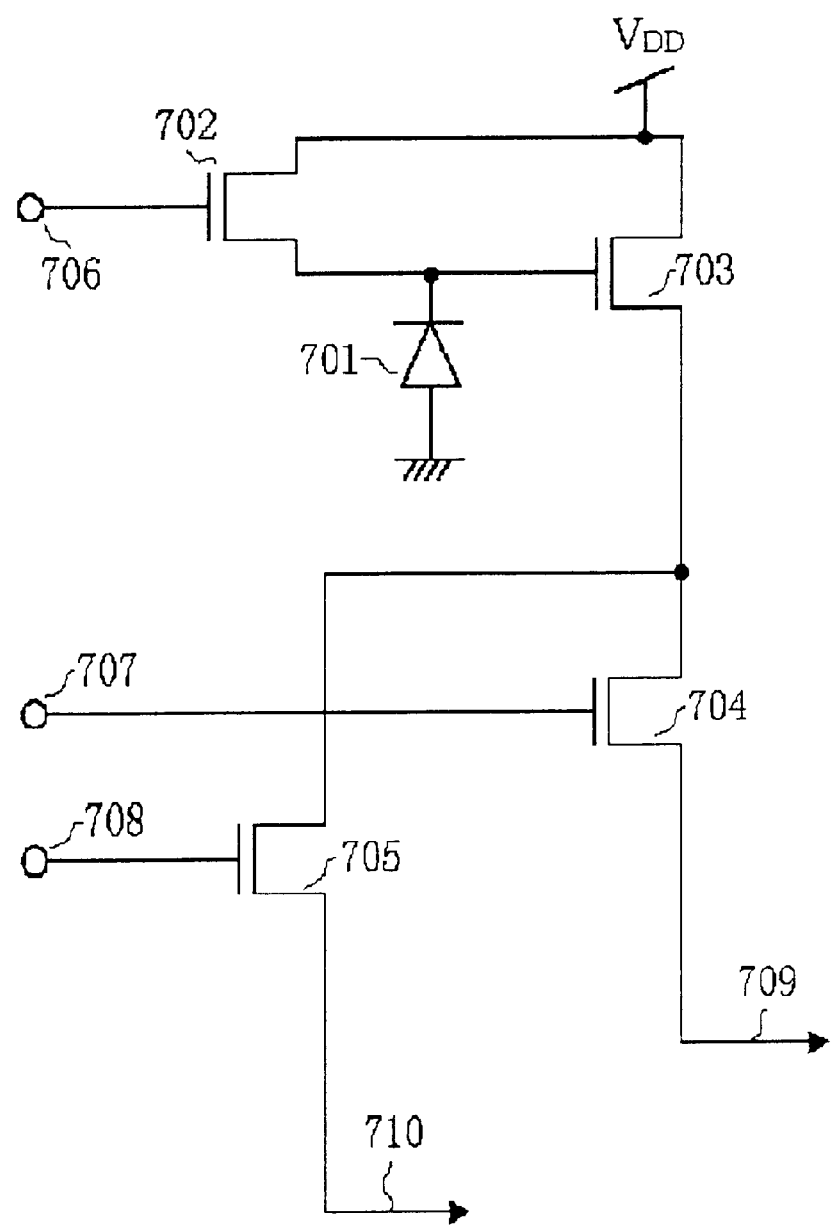
FIG. 10 is a circuit diagram of a pixel which is a part of the solid-state image sensor illustrated in FIG. 9.

The solid-state image sensor in accordance with the second embodiment is structurally different from the solid-state image sensor in accordance with the first embodiment in that each of the pixels in the second embodiment has such a structure as illustrated in FIG. 10, whereas each of the pixels in the first embodiment has such a structure as illustrated in FIG. 2.

With reference to FIG. 10, the pixel in the second embodiment is comprised of a photodiode 701, a first n-MOSFET 702 including a gate electrically connected to a bias terminal 706, a drain electrically connected to a source voltage VDD and a source electrically connected to the photodiode 701, a second n-MOSFET 703 including a gate electrically connected to the photodiode 701, a source electrically connected to the source voltage VDD and a drain, a third n-MOSFET 704 including a gate electrically connected to a terminal 707 through which a signal is input, a source electrically connected to the drain of the second transistor 703, and a drain electrically connected to a first output line 709, and a fourth n-MOSFET 705 including a gate electrically connected to a terminal 708 through which a signal is input, a source electrically connected to a node at which the drain of the second transistor 703 and the source of the third n-MOSFET 704 are connected to each other, and a drain electrically connected to a second output line 710.

In brief, the pixel illustrated in FIG. 10 is designed to additionally include the fourth n-MOSFET 705 in comparison with the pixel illustrated in FIG. 2.

In operation, when the third n-MOSFET 704 is turned on, a pixel output is transmitted through the first output line 709. When the fourth n-MOSFET 705 is turned on, a pixel output is transmitted through the second output line 710. When both the third and fourth n-MOSFETs 704 and 705 are turned on, pixel outputs are transmitted through both the first and second output lines 709 and 710.

The solid-state image sensor in accordance with the second embodiment is designed to include the first X- and Y-scanning circuits 605 and 606 for scanning a designated local area, and the second X- and Y-scanning circuits 603 and 604 for scanning all pixels. In accordance with the second embodiment, a signal for driving the first X- and Y-scanning circuits 605 and 606 and a signal for driving the second X- and Y-scanning circuits 603 and 604 can be transmitted independently of each other.

It is possible to design the solid-state image sensor as to stop driving he second X- and Y-scanning circuits 603 and 604 and start driving the first X- and Y-scanning circuits 605 and 606, when a detection signal is newly transmitted while the second X- and Y-scanning circuits 603 and 604 are scanning all pixels.

While the present invention has been described in connection with a certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-125518 filed on May 6, 13999 including specification, claims, drawings and summary is incorporated herein by reference in its entirety.

What is claimed is:

1. A solid-state image sensor comprising:
   (a) a plurality of pixels arranged in a matrix in a photoelectric transfer region;
   (b) at least one movement-detector detection movement in at least a portion of said image located in said photoelectric transfer region;
   (c) a first Y-scanner making successive access to said pixels in rows in a predetermined region in said photoelectric transfer region; and
   (d) a first X-scanner reading out signals running through signal output lines extending through said predetermined region,
   said first Y- and X-scanners both scanning a predetermined region associated with a movement-detector which has transmitted a detection signal, said detection signal being produced as a result of an incident light on said movement-detector varying with time.

2. The solid-state image sensor comprising:
   (a) a plurality of pixels arranged in a matrix in a photoelectric transfer region;
   (b) at least one movement-detector detecting movement in at least a portion of said image located in said photoelectric region;
   (c) a first Y-scanner making successive access to said pixels in rows in a predetermined region in said photoelectric transfer region; and
   (d) a first X-scanner reading out signals running through signal output lines extending through said predetermined region,
   said first Y- and X-scanners both scanning a predetermined region associated with a movement-detector which has transmitted a detection signal, wherein said solid-state image sensor includes a plurality of movement-detectors randomly positioned in said photoelectric transfer region.

3. The solid-state image sensor comprising:
   (a) a plurality of pixels arranged in a matrix in a photoelectric transfer region;
   (b) at least one movement-detector detecting movement in at least a portion of said image located in said photoelectric region;
   (c) a first Y-scanner making successive access to said pixels in rows in a predetermined region in said photoelectric transfer region; and
   (d) a first X-scanner reading out signals running through signal output lines extending through said predetermined region,
   said first Y- and X-scanners both scanning a predetermined region associated with a movement-detector which has transmitted a detection signal, wherein said predetermined region is a region extensive around said movement-detector.

4. The solid-state image sensor comprising:
   (a) a plurality of pixels arranged in a matrix in a photoelectric transfer region;
   (b) at least one movement-detector detecting movement in at least a portion of said image located in said photoelectric transfer region;
   (c) a first Y-scanner making successive access to said pixels in rows in a predetermined region in said photoelectric transfer region; and (d) a first X-scanner reading out signals running through signal output lines extending through said predetermined region, said first Y- and X-scanners both scanning a predetermined region associated with a movement-director which has transmitted a detection signal, and further comprising:

(e) a second Y-scanner making successive access to all of said pixels in rows in said photoelectric transfer region; and (f) a second X-scanner reading out signals running through all of the signal output lines extending through said photoelectric transfer region.

5. The solid-state image sensor comprising:

(a) a plurality of pixels arranged in a matrix in a photoelectric transfer region;

(b) at least one movement-detector detecting movement in at least a portion of said image located in said photoelectric transfer region;

(c) a first Y-scanner making successive access to said pixels in rows in a predetermined region in said photoelectric transfer region; and (d) a first X-scanner reading out signals running through signal output lines extending through said predetermined region, said first Y- and X-scanners both scanning a predetermined region associated with a movement-director which has transmitted a detection signal, and further comprising:

(e) a second Y-scanner making successive access to all of said pixels in rows in said photoelectric transfer region;

(f) a second X-scanner reading out signals running through all of the signal output lines extending through said photoelectric transfer region;

(g) a first switch to which said first Y-scanner makes access; and (h) a second switch to which said second Y-scanner makes access, a first signal being read through said first switch being output to a first signal output line, and a second signal being read through said second switch being output to a second signal output line.

6. The solid-state image sensor comprising:

(a) a plurality of pixels arranged in a matrix in a photoelectric transfer region;

(b) at least one movement-detector detecting movement in at least a portion of said image located in said photoelectric transfer region;

(c) a first Y-scanner making successive access to said pixels in rows in a predetermined region in said photoelectric transfer region;

(d) a first X-scanner reading out signals running through signal output lines extending through said predetermined region;

(e) a second Y-scanner making successive access to all of said pixels in rows in said photoelectric transfer region; and (f) a second X-scanner reading out signals running through all of the signal output lines extending through said photoelectric transfer region, said first and second scanners both scanning a predetermined region associated with a movement-detector which has transmitted a detection signal, wherein said first Y-scanner and X-scanners operate independently of said second Y- and X-scanners.

7. The solid-state image sensor as set forth in claim 1, wherein said predetermined region has a size defined by M pixels×N pixel wherein M and N are integers not greater than the number of pixels defining said solid-state image sensor.

8. The solid-state image sensor as set forth in claim 1, wherein each of said pixels is comprised of:

(a1) a photodiode;

(a2) a first transistor including a gate electrically connected to said photodiode, a source electrically connected to a voltage source, and a drain; and (a3) a second transistor including a gate electrically connected to a terminal through which a signal is input, a source electrically connected to said drain of said first transistor and, a drain electrically connected to a first output line.

9. The solid-state image sensor as set forth in claim 1, wherein each of said pixels is comprised of:

(a1) a photodiode;

(a2) a first transistor including a gate electrically connected to said photodiode, a source electrically connected to a voltage source, and a drain; and (a3) a second transistor including a gate electrically connected to a terminal through which a signal is input, a source electrically connected to said drain of said first transistor and, a drain electrically connected to a first output line; and (a4) a third transistor including a gate electrically connected to a terminal through which a signal is input, a source electrically connected to both said drain of said first transistor and said source of said second transistor, and a drain electrically connected to a second output line, wherein when said second transistor is turned on, a pixel output is transmitted through said first output line, when said third transistor is turned on, a pixel output is transmitted through said second output line, and when both said second and third transistors are turned on, a pixel output is transmitted through both said first and second output lines.

10. A solid-state image sensor comprising:

(a) a plurality of pixels arranged in a photoelectric transfer region defined by a plurality of sub-regions;

(b) a plurality of movement-detectors randomly arranged in said photoelectric transfer region, each of said movement-detectors detecting movement which has occurred in at least a portion of said image which is received in said photoelectric transfer region, and transmitting a detection signal; and (c) a scanner identifying a pixel transmitting said detection signal to thereby identify a sub-region in which said movement has occurred.

11. The solid-state image sensor as set forth in claim 10, wherein said scanner is comprised of a first Y-scanner making successive access to said pixels in rows in said photoelectric transfer region, and a first X-scanner reading out signals transmitted from said photoelectric transfer region, said first Y- and X-scanners identifying said sub-region associated with a movement-detector which has transmitted said detection signal.

12. The solid-state image sensor as set forth in claim 11, further comprising:

(e) a second Y-scanner making successive access to all of said pixels in rows in said photoelectric transfer region; and (f) a second X-scanner reading out all signals transmitted from said photoelectric transfer region.

13. The solid-state image sensor as set forth in claim 12, further comprising:

(g) a first switch to which said first Y-scanner makes access; and (h) a second switch to which said second Y-scanner makes access, a first signal being read through said first switch being output to a first signal output line, and a second signal being read through said second switch being output to a second signal output line.

14. The solid-state image sensor as set forth in claim 12, wherein said first Y- and X-scanners operate independently of said second Y- and X-scanners.

15. The solid-state image sensor as set forth in claim 10, wherein each of said pixels is comprised of:

(a1) a photodiode;

(a2) a first transistor including a gate electrically connected to said photodiode, a source electrically connected to a voltage source, and a drain; and (a3) a second transistor including a gate electrically connected to a terminal through which a signal is input, a source electrically connected to said drain of said first transistor and, a drain electrically connected to a first output line.

16. The solid-state image sensor as set forth in claim 10, wherein each of said pixels is comprised of:

(a1) a photodiode;

(a2) a first transistor including a gate electrically connected to said photodiode, a source electrically connected to a voltage source, and a drain;

(a3) a second transistor including a gate electrically connected to a terminal through which a signal is input, a source electrically connected to said drain of said first transistor and, a drain electrically connected to a first output line; and (a4) a third transistor including a gate electrically connected to a terminal through which a signal is input, a source electrically connected to both said drain of said first transistor and said source of said second transistor, and a drain electrically connected to a second output line, wherein when said second transistor is turned on, a pixel output is transmitted through said first output line, when said third transistor is turned on, a pixel output is transmitted through said second output line, and when both said second and third transistors are turned on a pixel output is transmitted through both said first and second output lines.

17. A method of driving a solid-state image sensor, comprising the steps of:

(a) transmitting a detection signal when movement has been detected in at least a portion of said image which is received in a photoelectric transfer region including a plurality of sub-regions, said movement has being detected based on incident light on at least a portion of said photoelectric transfer region varying with time; and (b) starting scanning a sub-region associated with a detecting circuit which has transmitted said detection signal.

18. The method as set forth in claim 17, further comprising the step of stopping scanning said photoelectric transfer region when movement is detected while said photoelectric transfer region is being scanned in entirety, and starting scanning a sub-region associated with a detecting circuit which has detected said movement.

19. A method of driving a solid-state image sensor, comprising the steps of:

(a) transmitting a detection signal when movement has been detected in at least a portion of said image which is received in a photoelectric transfer region including a plurality of sub-regions; and (b) starting scanning a sub-region associated with a detecting circuit which has transmitted said detection signal, and further comprising the step of, when a second detecting circuit has transmitted a second detection signal indicating that movement has been detected in a second sub-region while a first sub-region is being scanned in response to a first detection signal transmitted by a first detecting circuit, indicating that movement has been detected in said first sub-region, starting scanning said second sub-region after said first sub-region has been completed to be scanned.

20. A method of driving a solid-state image sensor, comprising the steps of:

(a) transmitting a detection signal when movement has been detected in at least a portion of said image which is received in a photoelectric transfer region including a plurality of sub-regions; and (b) starting scanning a sub-region associated with a detecting circuit which has transmitted said detection signal, and further comprising the step of, when a second detecting circuit has transmitted a second detection signal indicating that movement has been detected in a second sub-region while a first sub-region is being scanned in response to a first detection signal transmitted by a first detecting circuit, indicating that movement has been detected in said first sub-region, immediately starting scanning said second sub-region, if said first and second sub-regions do not have common row and column.

21. The method as set forth in claim 17, wherein when movements have been detected in a plurality of sub-regions, said sub-regions are scanned in accordance with a predetermined order.

* * * * *